United States Patent
Noguchi

(10) Patent No.: US 6,737,936 B2
(45) Date of Patent: May 18, 2004

(54) SURFACE-ACOUSTIC-WAVE DUPLEXER WITH IMPROVED ISOLATION

(75) Inventor: Kazushige Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 14 days.

(21) Appl. No.: 10/105,426

(22) Filed: Mar. 26, 2002

(65) Prior Publication Data

US 2002/0158707 A1 Oct. 31, 2002

(30) Foreign Application Priority Data

Apr. 27, 2001 (JP) ........................................ 2001-131314

(51) Int. Cl.[7] ............................... H03H 9/72; H03H 9/64
(52) U.S. Cl. ........................ 333/133; 333/193; 333/195
(58) Field of Search ............................ 333/133, 193–196

(56) References Cited

U.S. PATENT DOCUMENTS

| | | | | |
|---|---|---|---|---|
| 5,726,610 A | * | 3/1998 | Allen et al. | .................. 333/133 |
| 5,864,260 A | * | 1/1999 | Lee | .............................. 333/133 |
| 6,246,148 B1 | * | 6/2001 | Flowers et al. | ......... 310/313 B |
| 6,369,672 B1 | * | 4/2002 | Ikada | .......................... 333/193 |
| 6,380,823 B1 | * | 4/2002 | Ikata et al. | ................. 333/133 |

FOREIGN PATENT DOCUMENTS

| | | | | |
|---|---|---|---|---|
| JP | 57-63921 | * | 4/1982 | ................. 333/155 |
| JP | 62-105514 | * | 5/1987 | ................. 333/193 |
| JP | 3-145320 | * | 6/1991 | ................. 333/193 |
| JP | 5-299969 | * | 11/1993 | ................. 333/193 |
| JP | 6-232688 | * | 8/1994 | ................. 333/195 |

* cited by examiner

*Primary Examiner*—Barbara Summons
(74) *Attorney, Agent, or Firm*—Rabin & Berdo, P.C.

(57) ABSTRACT

A duplexer has four surface-acoustic-wave resonators, forming two filters, integrated on a piezoelectric substrate. The surface-acoustic-wave resonators are laid out so that the two resonators with intermediate resonance frequencies are separated from each other by one or both of the resonators with the highest and lowest resonance frequencies, thereby improving isolation between the two filters. In one configuration the two filters are ladder filters, and the resonators are laid out in a row in which the series-arm resonator of the receiving filter is followed by the shunt-arm resonator of the receiving filter, then the series-arm resonator of the transmitting filter, then the shunt-arm resonator of the transmitting filter. The two filters may also be separated by a groove in the substrate.

20 Claims, 7 Drawing Sheets

US 6,737,936 B2

SURFACE-ACOUSTIC-WAVE DUPLEXER WITH IMPROVED ISOLATION

BACKGROUND OF THE INVENTION

1. Field of the Invention

The present invention relates to mobile communication equipment and, more particularly, to a surface-acoustic-wave duplexer for use in the radio-frequency section of, for example, a mobile telephone.

2. Description of the Related Art

Two types of surface-acoustic-wave (SAW) duplexers are known. In the first type, a transmitting SAW filter and a receiving SAW filter are formed on two separate piezoelectric substrates, which are mounted in separate cavities in a single duplexer package. In the second or monolithic type, a single piezoelectric substrate, on which both a transmitting SAW filter and a receiving SAW filter are formed, is mounted in the duplexer package. In the monolithic type of SAW duplexer, the shunt-arm SAW resonator of the transmitting SAW filter and the series-arm SAW resonator of the receiving SAW filter are conventionally disposed side by side.

FIG. 1 schematically illustrates the layout of a SAW duplexer of the monolithic type, wherein a transmitting SAW filter and a receiving SAW filter are formed on a single piezoelectric substrate or chip 10. These two filters include four SAW resonators, which are laid out in a row in the following order: a transmitting series-arm SAW resonator 11, a transmitting shunt-arm SAW resonator 12, a receiving series-arm SAW resonator 13, and a receiving shunt-arm SAW resonator 14. In this and subsequent drawings, Tx is used as an abbreviation for transmitting, Rx for receiving, S for series-arm, and P for shunt-arm.

When a monolithic SAW duplexer of this type is employed, problems of crosstalk from the transmitting circuits to the receiving circuits are observed. The transmit-to-receive isolation characteristic is influenced by many factors, such as the composite frequency characteristic of the signal path from the transmitting terminal to the antenna terminal and the signal path from the antenna terminal to the receiving terminal, the impedance characteristic of the signal path from the transmitting filter to the fifty-ohm (50-Ω) antenna termination to the receiving filter, and interference (coupling) due to the monolithic layout of the SAW resonators of the two filters.

In some mobile communication systems, such as the J-cdma (Japanese code division multiple access) system, the transmitting band and the receiving band are both divided in two. In this type of system, a duplexer with a full-band configuration, i.e., a duplexer that covers all parts of each band, requires comparatively wide passbands. For J-cdma, the passband width must be thirty-eight megahertz (38 MHz). This forces the transmitting band and the receiving band to be closely adjacent, and when the SAW resonators are all disposed on one chip, interference between them becomes inevitable.

The basic principle of a SAW filter is the propagation of surface waves on a piezoelectric substrate (e.g., $LiTaO_3$) that is patterned to function as a bandpass filter by modal resonance. For a J-cdma mobile phone, the isolation characteristic of interest is that in the transmitting frequency band (887 MHz to 925 MHz). The receiving frequency characteristic in this band is dominated by the series-arm SAW resonator of the receiving filter. Since a two-chip duplexer is free of isolation problems and a monolithic duplexer is not, it is evident that the series-arm SAW resonator of the receiving filter is affected by interference from the adjacent shunt-arm SAW resonator of the transmitting filter.

By increasing the number of SAW resonators in the series arm of the receiving filter or the shunt arm of the transmitting filter, it is possible to increase the attenuation of one filter in the passband of the other filter. However, as long as the shunt-arm SAW resonators in the transmitting filter and the series-arm SAW resonators in the receiving filter are disposed side by side, some surface acoustic waves will propagate from the shunt-arm SAW resonators of the transmitting filter to the series-arm SAW resonators of the receiving filter on the surface of the piezoelectric substrate disposed between the shunt arm of the transmitting filter and the series arm of the receiving filter, degrading the isolation characteristic between the two filters by reducing the attenuation of each filter in the passband of the other filter.

A more detailed explanation of this problem will be given with reference to a simulated example. FIGS. 2, 3, 4, and 5 show characteristics, as determined by simulation, of SAW resonators of the general type employed in the present invention.

FIG. 2 shows the frequency characteristic of a series-arm SAW resonator. The attenuation loss is one-half decibel (−0.5 dB) at a frequency of 860 MHz, −2 dB at 870 MHz, −4 dB at 880 MHz, −18 dB at 890 MHz, −3 dB at 900 MHz, =2 dB at 910 MHz, and −2 dB at 920 MHz. The return loss is −23 dB at 860 MHz, −11 dB at 870 MHz, −3 dB at 880 MHz, −2 dB at 890 MHz, −3 dB at 900 MHz, −6 dB at 910 MHz, and −8 dB at 920 MHz.

FIG. 3 shows the reflection coefficient characteristic of a reflector that can be used in a series-arm SAW resonator. The reflection coefficient is 0.65 at a frequency of 860 MHz, 0.95 at 880 MHz, 0.95 at 900 MHz, and 0.95 at 920 MHz.

FIG. 4 shows the frequency characteristic of a shunt-arm SAW resonator. The attenuation loss is −13 dB at a frequency of 860 MHz, −24 dB at 870 MHz, −4 dB at 880 MHz, −2 dB at 890 MHz, −2 dB at 900 MHz, −2 dB at 910 MHz, and −2 dB at 920 MHz. The return loss is −2 dB at 860 MHz, −2 dB at 870 MHz, −5 dB at 880 MHz, −17 dB at 890 MHz, −10 dB at 900 MHz, −7 dB at 910 MHz, and −6 dB at 920 MHz.

FIG. 5 shows the reflection coefficient characteristic of a shunt-arm SAW resonator. The reflection coefficient is 0.55 at a frequency of 860 MHz, 0.95 at 880 MHz, 0.95 at 900 MHz, and 0.95 at 920 MHz. In the frequency band between 860 MHz and 840 MHz, however, the reflection coefficient is significantly reduced, becoming about 0.20 to 0.40, only about 30% of the reflection coefficient in the band between 860 MHz and 920 MHz.

The frequency characteristics and reflector reflection coefficient characteristics shown in FIGS. 2, 3, 4 and 5 were obtained by simulating the operation of, for example, a series-arm SAW resonator having one interdigital transducer (IDT) with an aperture of one hundred micrometers (100 µm) and one hundred pairs of electrode fingers. The attenuation loss characteristics in FIGS. 2 and 4 are the characteristics of a resonator provided with a reflector.

FIG. 6 illustrates the frequency characteristic 15 of the transmitting filter and the frequency characteristic 16 the receiving filter in a conventional duplexer, indicating the resonance frequency $f_{RxP}$ of the shunt-arm SAW resonator in the receiving filter, the resonance frequency $f_{RxS}$ of the series-arm SAW resonator in the receiving filter, the resonance frequency $f_{TxP}$ of the shunt-arm SAW resonator in the transmitting filter, and the resonance frequency $f_{TxS}$ of the series-arm SAW resonator in the transmitting filter. FIG. 7 schematically illustrates the isolation characteristic of a SAW duplexer. In region A (shaded), which is the region in which interference occurs, the isolation characteristic is determined predominantly by the frequency characteristic of the series-arm SAW resonator transducer of the receiving filter.

In the series-arm SAW resonator shown in FIG. 2, the attenuation loss in the series resonance band centered at the lower resonance frequency of 860 MHz is only about 0.5 dB, indicating that little leakage of surface acoustic waves occurs at this frequency. As can be seen in FIG. 3, the reflection coefficient characteristic is about 60% or more, so the small amount of leakage is further reduced and causes little problem.

On the other hand, in the shunt-arm SAW resonator shown in FIG. 4, the attenuation loss in the series resonance band centered at the lower resonance frequency of 860 MHz is about 13 dB, and as shown in FIG. 5, the reflection coefficient characteristic at this frequency is about 30%, so considerably more leakage of surface acoustic waves occurs. This leakage from the shunt-arm SAW resonator appears as noise in the output of the series-arm SAW resonator.

As noted above, the reflection characteristic of the reflector in the frequency band below 860 MHz is about 30% of that in the frequency band above 860 MHz. Therefore, if the leakage of signals from the shunt-arm SAW resonator of the transmitting filter into the series-arm SAW resonator of the receiving filter increases, it becomes difficult for the series-arm SAW resonator of the receiving filter to generate a pole (a point where the attenuation increases sharply) in the band above 860 MHz (i.e., it becomes difficult to generate a pole to increase the attenuation). As a result, the frequency characteristic of the receiving filter in the band above 860 MHz is degraded (the attenuation is decreased).

The above problem of leakage or isolation can also be viewed as being due to the distance between the transducers in different resonators.

SUMMARY OF THE INVENTION

An object of the present invention is to provide a SAW duplexer in which a transmitting filter and a receiving filter are integrated on a single chip, while providing sufficient attenuation to meet isolation requirements in the transmitting frequency band.

The invented duplexer has a piezoelectric substrate on which a first filter and a second filter are integrated. The first filter includes a first SAW resonator and a second SAW resonator. The second filter includes a third SAW resonator and a fourth SAW resonator. The four SAW resonators comprise, for example, respective interdigital transducers with reflectors. Among the four SAW resonators, the first SAW resonator has the lowest resonance frequency and the fourth SAW resonator has the highest resonance frequency. At least one of the second and third SAW resonators is placed at one end of the piezoelectric substrate, adjacent to the first or fourth SAW resonator, so that the second and third SAW resonators are mutually separated. Preferably, the second and third SAW resonators are disposed at mutually opposite ends of the piezoelectric substrate.

In one configuration, the first filter is a ladder filter and the second SAW resonator is its series-arm resonator, while the second filter is a ladder filter and the third SAW resonator is its shunt-arm resonator. If the first filter is the receiving filter and the second filter is the transmitting filter, then either the shunt-arm SAW resonator of the receiving filter or the series-arm SAW resonator of the transmitting filter, or both of these SAW resonators, is disposed between the series-arm SAW resonator of the receiving filter and the shunt-arm SAW resonator of the transmitting filter. In a preferred configuration, the four SAW resonators are arranged in a row, with the series-arm SAW resonator of the lower-frequency filter followed by the shunt-arm SAW resonator of the lower-frequency filter, then the series-arm SAW resonator of the higher-frequency filter, then the shunt-arm SAW resonator of the higher-frequency filter.

Separation of the second and third SAW resonators provides sufficient isolation between the two filters, even if the resonance frequencies of the second and third SAW resonators are closely adjacent. The isolation may be further improved by providing a groove in the substrate between the first and second filters.

DETAILED DESCRIPTION OF THE INVENTION

Figure 1:
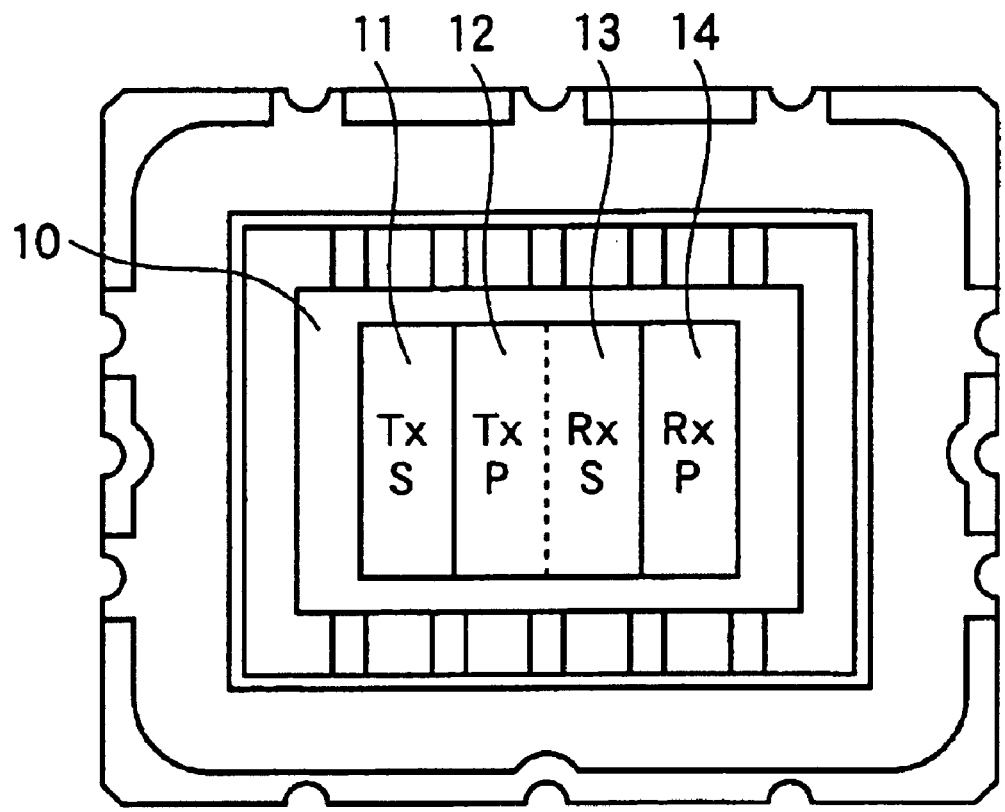
FIG. 1 is a schematic drawing of the layout of a conventional monolithic transmitting and receiving filter chip without a groove.
Figure 2:
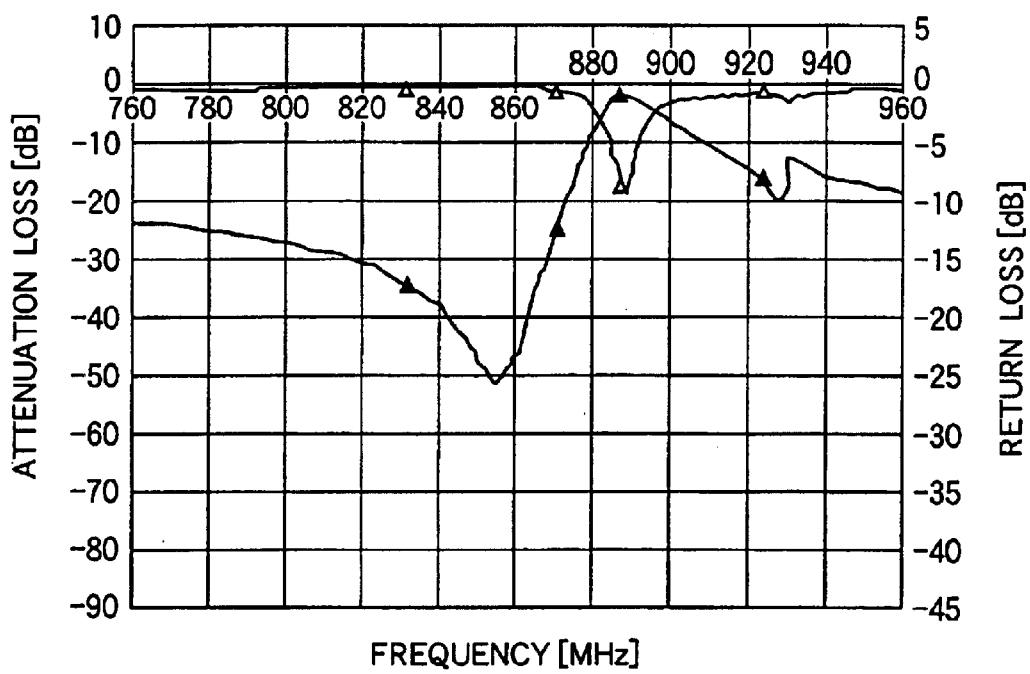
FIG. 2 is a graph showing a simulated frequency characteristic of a series-arm SAW resonator.
Figure 3:
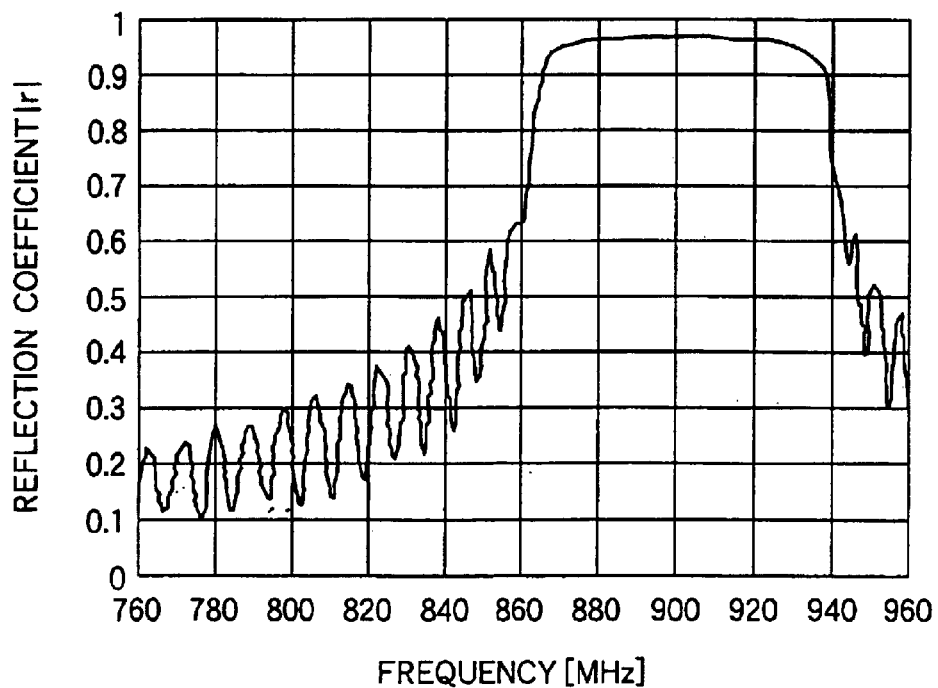
FIG. 3 is a graph showing a simulated reflection coefficient characteristic of a series-arm SAW resonator.
Figure 4:
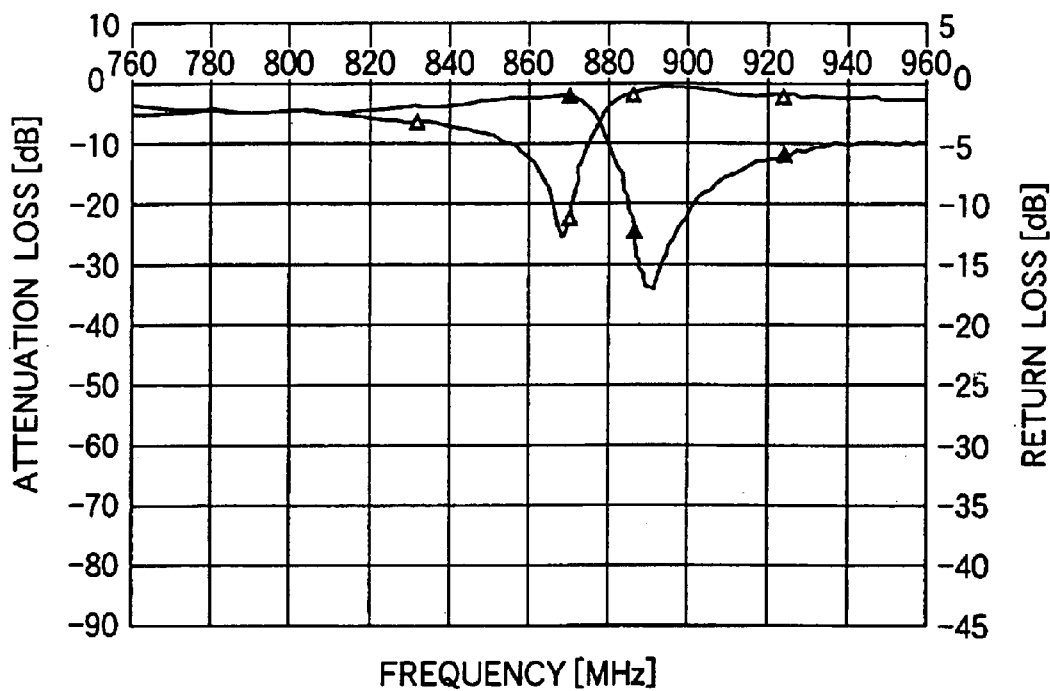
FIG. 4 is a graph showing a simulated frequency characteristic of a shunt-arm SAW resonator.
Figure 5:
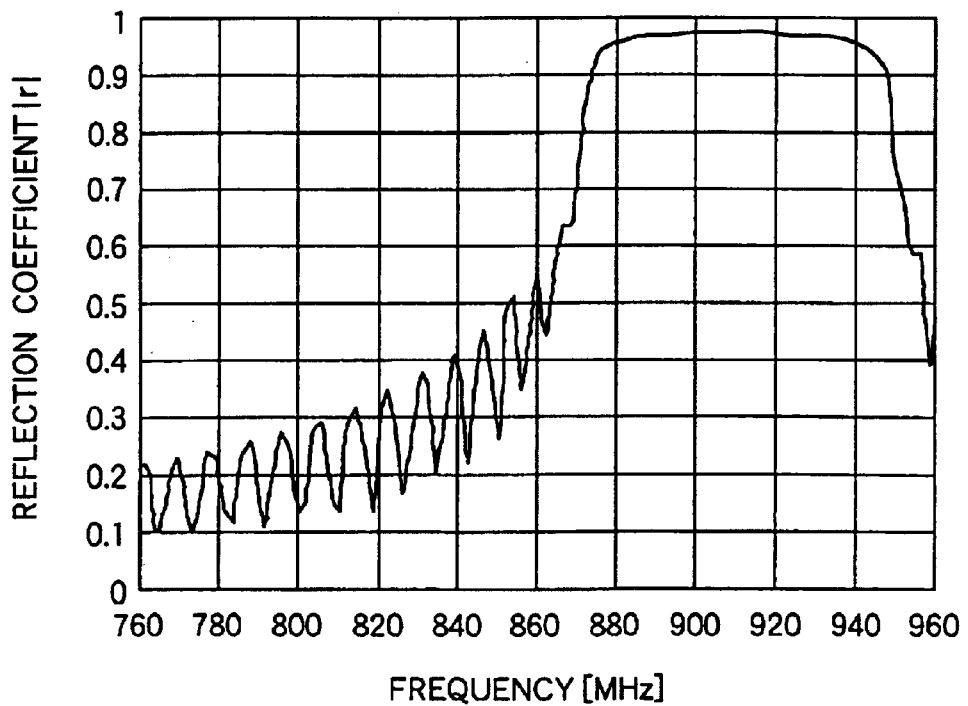
FIG. 5 is a graph showing a simulated reflection coefficient characteristic of a shunt-arm SAW resonator.
Figure 6:
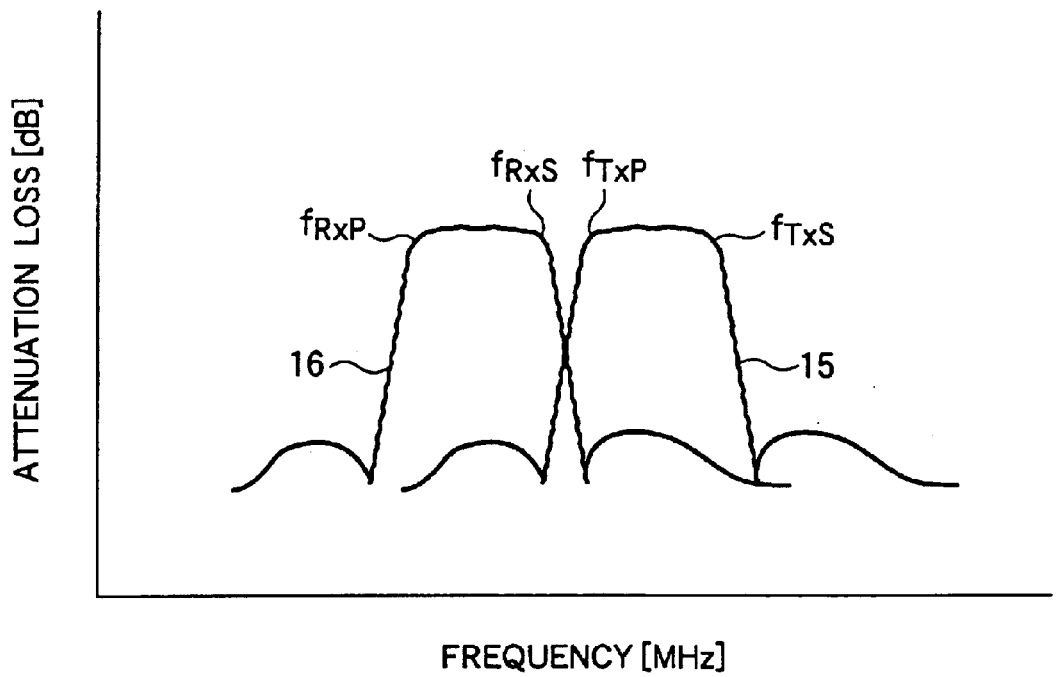
FIG. 6 is a graph schematically showing the frequency characteristics of a transmitting filter and a receiving filter.

Embodiments of the invention will now be described with reference to the attached drawings, in which like elements are indicated by like reference characters. The filters in the embodiments have a known ladder configuration in which a series resonator is coupled between the input and output terminals, and a shunt resonator is coupled between the input terminal or output terminal and ground.

Figure 8:
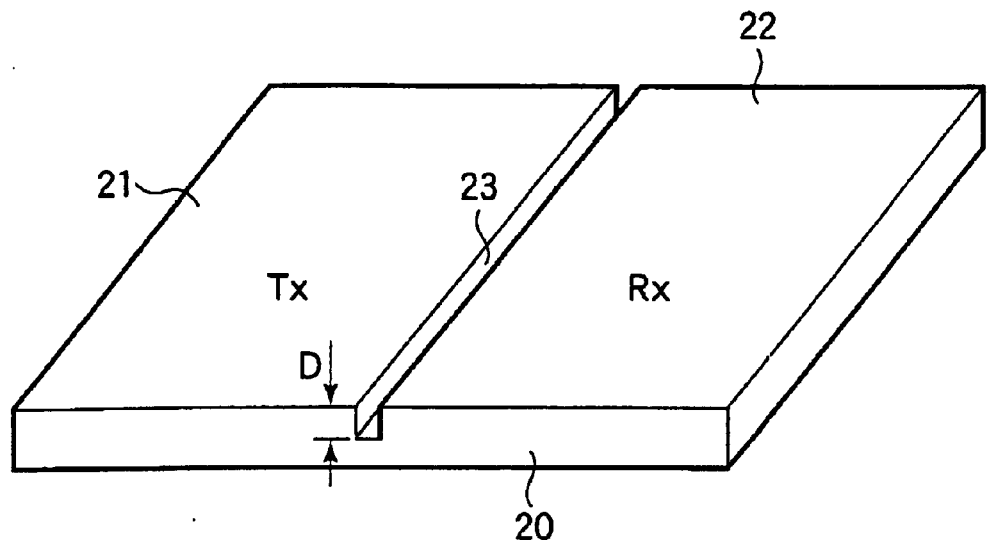
FIG. 8 is a perspective view of a monolithic transmitting and receiving filter chip with a groove at the boundary between the transmitting filter and the receiving filter, illustrating a first embodiment of the invention.

Referring to FIG. 8, the first embodiment is a monolithic transmitting and receiving filter chip comprising a piezoelectric (LiTaO$_3$) substrate 20, a transmitting filter 21, a receiving filter 22, and a groove 23. The filters 21, 22 include SAW transducers (not shown) of the known type having reflectors disposed on both sides of an interdigital transducer formed on the piezoelectric substrate 20. The groove 23 has a depth D in the piezoelectric substrate 20, and runs between the transmitting filter 21 and receiving filter 22.

Next, the reason for providing the groove 23 will be described.

Figure 9:
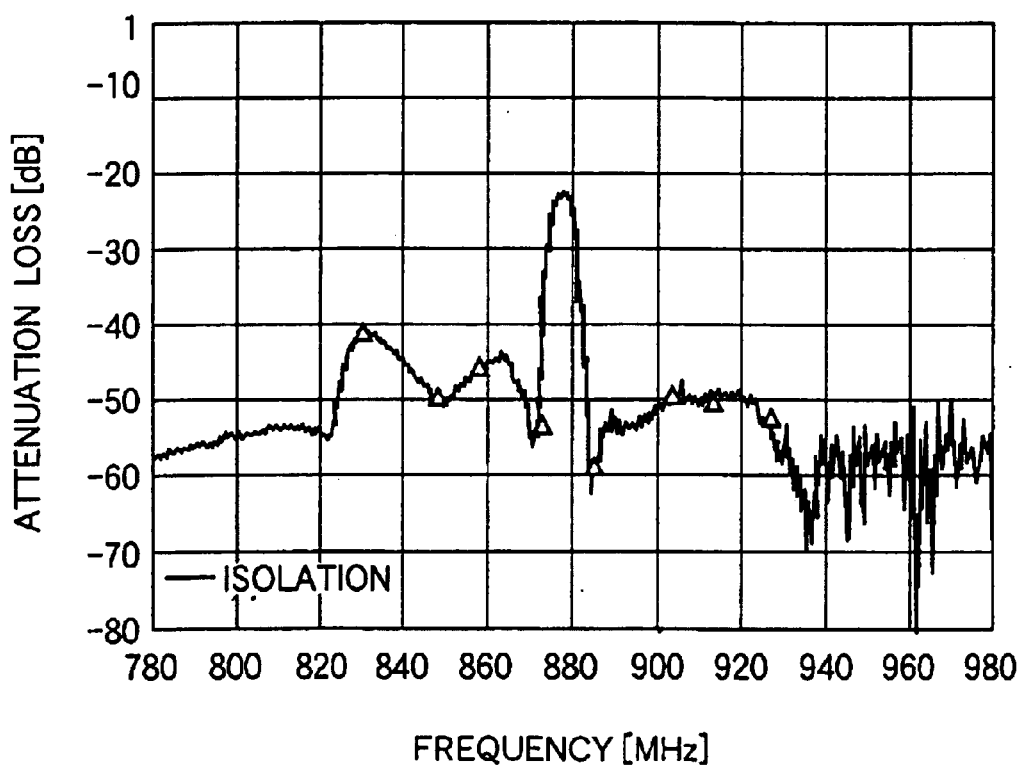
FIG. 9 is a graph showing the isolation characteristic of the monolithic transmitting and receiving filter chip of the first embodiment when the groove is 30 $\mu$m deep.
Figure 10:
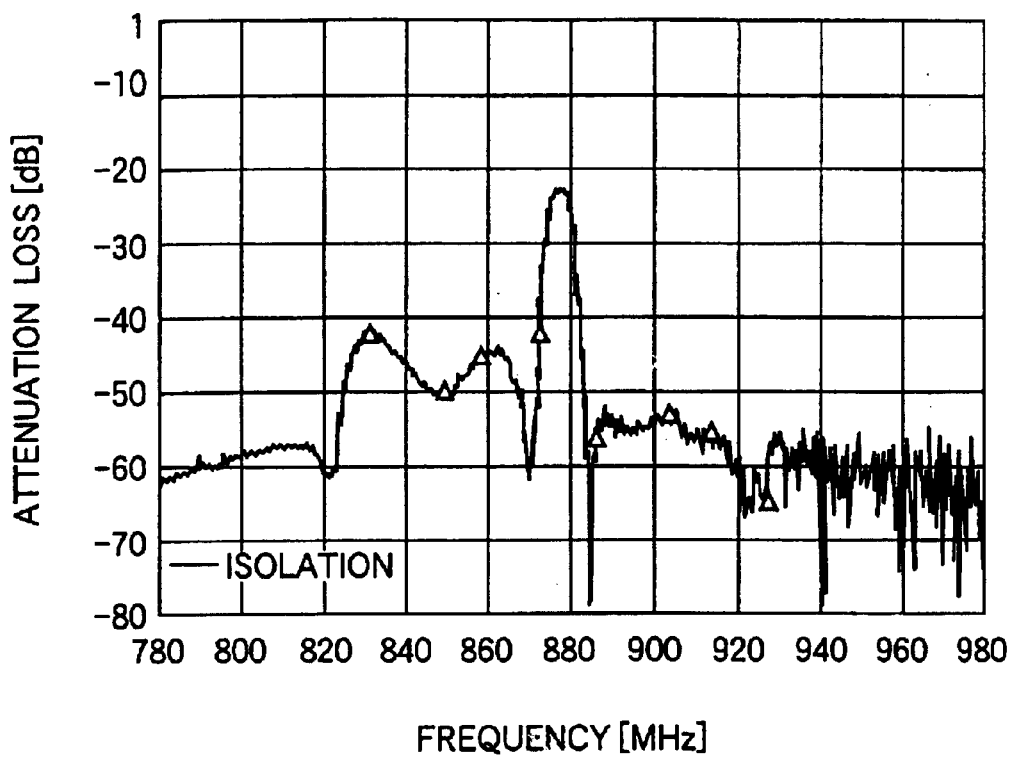
FIG. 10 is a graph showing the isolation characteristic of the monolithic transmitting and receiving filter chip of the first embodiment when the groove is 70 $\mu$m deep.

FIGS. 9 and 10 show the isolation characteristic in the band of interest, namely the transmitting band at the receiving end as viewed from the transmitting end, when the groove 23 has two different depths D.

FIG. 9 shows the isolation characteristic of a monolithic transmitting and receiving filter chip having a groove 23 as in the first embodiment when the depth D of the groove 23 is thirty micrometers (30 μm). The attenuation loss is −46 dB at a frequency of 860 MHz, −24 dB at 880 MHz, −52 dB at 900 MHz, and −50 dB at 920 MHz.

FIG. 10 shows the isolation characteristic of a monolithic transmitting and receiving filter chip having a groove 23 as in the first embodiment when the depth D of the groove 23 is 70 μm. The attenuation loss is −45 dB at a frequency of 860 MHz, −25 dB at 880 MHz, −53 dB at 900 MHz, and −58 dB at 920 MHz.

Figure 11:
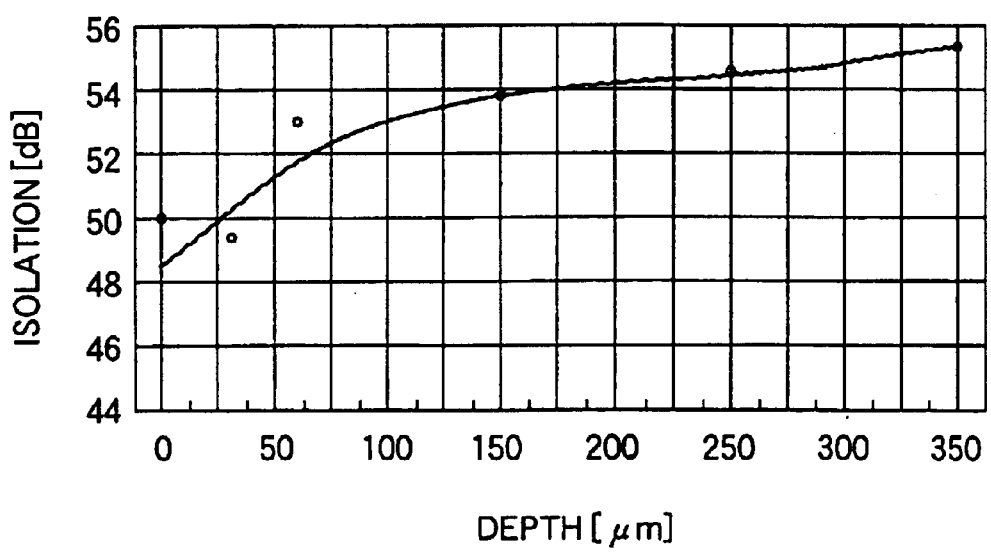
FIG. 11 is a graph showing the isolation characteristic of the first embodiment as a function of the depth of the groove.

FIG. 11 shows the isolation (attenuation) characteristic plotted as a function of the depth D of the groove 23, which is shown on the horizontal axis. The isolation data were obtained at a frequency of 902.5 MHz. The isolation characteristic is −49.9 dB for a depth D of 0 μm (that is, for no groove), −49.7 dB for a depth D of 30 μm, −53.0 dB for a depth D of 70 μm, −53.8 dB for a depth D of 150 μm, −54.6 dB for a depth D of 250 μm, and −55.4 dB for a depth D of 350 μm.

As can be seen from FIG. 11, the deeper the groove 23 is between the transmitting filter and the receiving filter, the greater the attenuation (isolation) becomes in the transmitting band. Incidentally, the data in FIGS. 9 to 11 were obtained for a configuration in which the shunt-arm SAW resonator of the transmitting filter was adjacent to the series-arm SAW resonator on the receiving filter.

Thus, in order to prevent the shunt-arm SAW resonator of the transmitting filter from interfering with the series-arm SAW resonator of the receiving filter, due to the leakage of surface acoustic waves from one SAW resonator to the other, in a duplexer having a transmitting filter and receiving filter integrated on a single chip, the first embodiment of invention provides a groove in the surface of the piezoelectric substrate between the two filters. A groove 23 with a depth of, for example, 30 μm or 70 μm at the boundary between the transmitting filter and the receiving filter can interrupt and largely suppress the shear-horizontal waves (SH waves) that excite the surface of the substrate and thus lead to interference between the shunt-arm SAW resonator transducer of the transmitting filter and the series-arm SAW resonator transducer of the receiving filter.

The groove provided at the boundary between the transmitting filter and the receiving filter in the first embodiment also suppresses interference due to bulk waves.

Similar effects can be also obtained by means of slits or through-holes, instead of a groove.

Next, a second embodiment of the present invention will be described.

Figure 12:
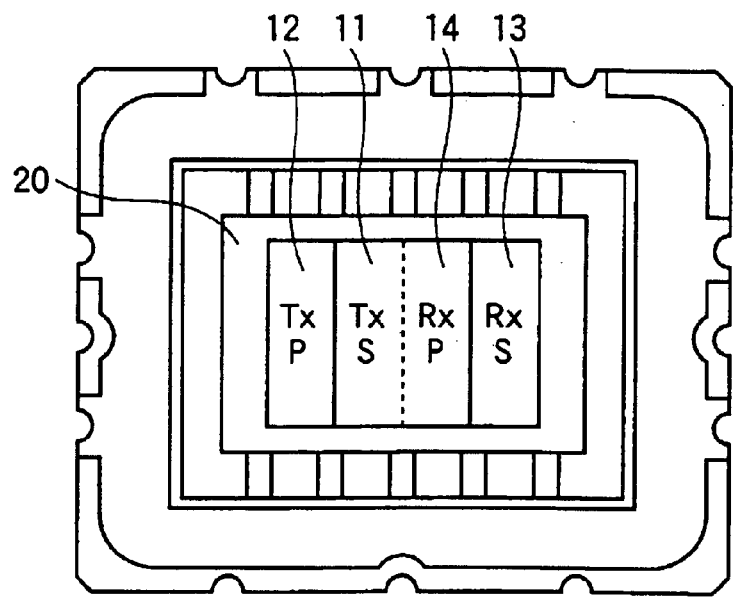
FIG. 12 is a schematic drawing of the layout of a monolithic transmitting and receiving filter chip according to a second embodiment of the invention.

Referring to FIG. 12, the second embodiment places a transmitting filter having a series-arm SAW resonator 11 and a shunt-arm SAW resonator 12 and a receiving filter having a series-arm SAW resonator 13 and a shunt-arm SAW resonator 14 side by side on a single piezoelectric substrate or chip 20. The difference between the second embodiment and the conventional chip layout shown in FIG. 1 is that the positions of the shunt-arm SAW resonator transducer 12 and series-arm SAW resonator transducer 11 are interchanged in the transmitting filter, and the positions of the shunt-arm SAW resonator transducer 14 and series-arm SAW resonator 13 are interchanged in the receiving filter. As a result, the series-arm SAW resonator 13 of the receiving filter, which is susceptible to interference from the shunt-arm SAW resonator 12 of the transmitting filter in one chip, is placed as far as possible from the shunt-arm SAW resonator 12 of the transmitting filter.

Furthermore, both the series-arm SAW resonator 11 of the transmitting filter and the shunt-arm SAW resonator 14 of the receiving filter are disposed between the series-arm SAW resonator 13 of the receiving filter and the shunt-arm SAW resonator 12 of the transmitting filter. Thus the two SAW resonator transducers which might interfere with each other are disposed at mutually opposite ends of the chip 20, and other SAW transducers are placed between them.

Surface waves attenuate as they propagate, so the farther a surface wave is from its source, the smaller its amplitude becomes. Typically, interference can be reduced by leaving a space of a few millimeters between the transducers of adjacent SAW resonators. Interference can also be reduced by placing another SAW resonator between the two SAW resonators in question, thereby interrupting the progress of the interfering surface acoustic waves.

The second embodiment may also include a groove between the transmitting filter and receiving filter, as in the first embodiment, but the second embodiment can reduce interference simply by changing the layout of a conventional type of duplexer chip, even if no groove is provided.

Figure 7:
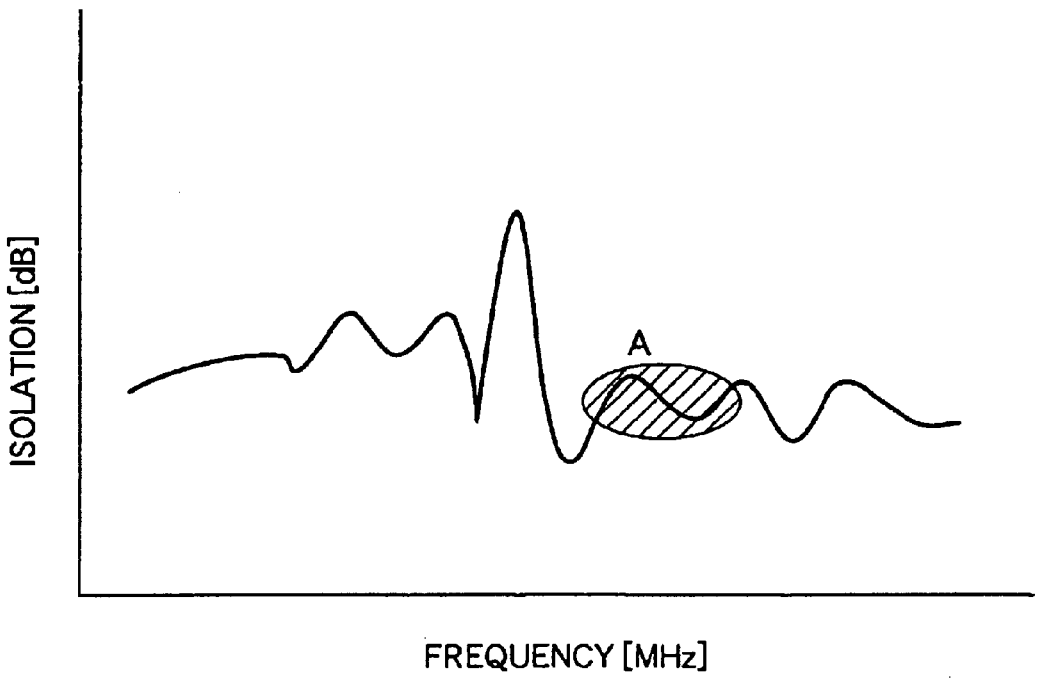
FIG. 7 is a graph schematically showing the isolation characteristic of a duplexer.

As was shown by the reflection coefficient data in FIGS. 2, 3, 4 and 5, at the upper resonance frequency of a SAW filter, almost all surface acoustic waves that escape from the interdigital transducer of the relevant SAW resonator can be reflected back by the adjacent reflectors, but at the lower resonance frequency, only about 30% of the escaping waves can be reflected. Moreover, the region A in FIG. 7 in which isolation problems occur is disposed around the lower resonance frequency of the transmitting filter, where isolation must be provided by the series-arm SAW resonator of the receiving filter.

The reason for the isolation problem in the prior art is that the reflectors in the shunt-arm SAW resonator of the transmitting filter cannot reflect sufficient wave energy at the lower resonance frequency to prevent leakage from interfering with the adjacent series-arm SAW resonator transducer of the receiving filter.

In the chip layout shown in FIG. 12, similar wave leakage occurs from the series-arm SAW resonator 11 of the transmitting filter toward the adjacent shunt-arm SAW resonator 14 of the receiving filter, but the leakage is less, because more of the wave energy is reflected by the reflectors in the series-arm SAW resonator 11 of the transmitting filter. Furthermore, the resonance frequencies of these two SAW resonators 11, 14 are so widely separated from each other that substantially no interference occurs. Thus, there is no degradation of the isolation characteristic.

Accordingly, the leakage of surface acoustic waves from the series-arm SAW resonator 11 of the transmitting filter toward the shunt-arm SAW resonator 14 of the receiving filter does not have the effect, seen in the prior art, of suppressing the appearance of poles of attenuation in the frequency band from 887 MHz to 925 MHz (the passband of the transmitting filter, in which the receiving filter must provide high attenuation). The frequency characteristic of the receiving filter in the band from 887 MHz to 925 MHz is thus improved.

Figure 13:
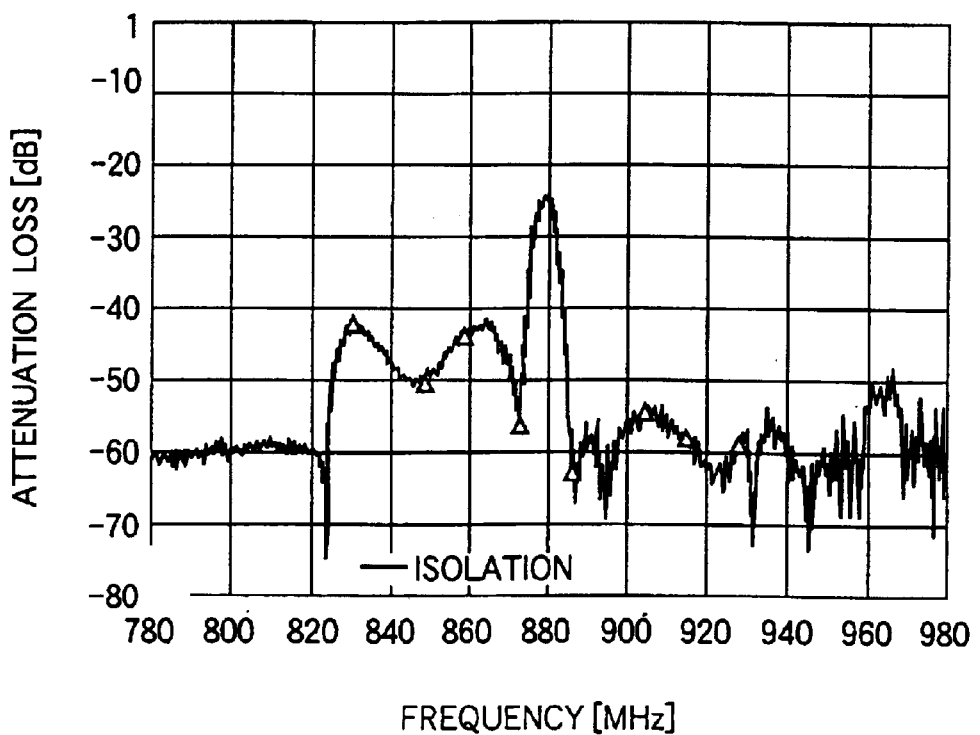
FIG. 13 is a graph showing the isolation characteristic of the monolithic transmitting and receiving filter chip in the second embodiment.

FIG. 13 shows the isolation characteristic of a monolithic transmitting and receiving filter chip in which the positions of the SAW resonators have been interchanged as in the second embodiment of the present invention The attenuation loss is −44 dB at a frequency of 860 MHz, −25 dB at 880 MHz, −55 dB at 900 MHz, and −63 dB at 920 MHz. At the lower two of these frequencies (860 MHz and 880 MHz), the isolation performance is comparable to that in the first embodiment, but at the upper two frequencies (900 MHz and 920 MHz), which are disposed in the passband of the transmitting filter, the isolation performance is improved by amounts ranging from 2 dB to 13 dB. The improvement can be seen by comparing FIG. 13 with FIGS. 9 and 10.

In summary, the second embodiment places the two SAW resonators 12, 13 most apt to interfere with each other at mutually opposite ends of the chip substrate 20, and places the two SAW resonators 11, 14 having the most widely separated resonance frequencies side by side at the center of the chip. This arrangement can substantially eliminate interference between the various SAW resonators and maintain a good isolation characteristic even when both filters are integrated on the same chip.

As described above, by providing a groove at the boundary between the transmitting filter and the receiving filter on the piezoelectric chip substrate of a SAW duplexer, and by separating the transmitting and receiving SAW resonators having adjacent resonance frequencies, the present invention reduces interference between the two filters, particularly if the two SAW resonators having adjacent resonance frequencies are placed at mutually opposite ends of the chip. A similar effect can also be obtained, in the same way, if there are more than two filters on the same chip.

The embodiments described above reduced interference in a duplexer having four SAW resonators disposed in a single row, but similar effects can be obtained when there are more than four SAW resonators, by separating SAW resonators with adjacent resonance frequencies, and by providing a groove. Moreover, the SAW resonators need not be disposed in a single row.

The two SAW resonators that were separated in the second embodiment were the shunt-arm SAW resonator of the transmitting filter and the series-arm SAW resonator of the receiving filter, but if the two SAW resonators having adjacent resonance frequencies are another pair of SAW resonators (e.g., the series-arm SAW resonator of the transmitting filter and the shunt-arm SAW resonator of the receiving filter), a similar effect can be obtained by separating that pair of SAW resonators.

The term 'separating' may mean either that the two SAW resonators are separated by a certain distance, or that another SAW resonator intervenes between the two SAW resonators. Preferably, both of these types of separation are employed, as in the second embodiment.

Those skilled in the art will recognize that further variations are possible within the scope claimed below.

What is claimed is:

1. A surface-acoustic-wave (SAW) duplexer comprising:
   a piezoelectric substrate having a first end and a second end opposite the first end;
   a first filter having a first SAW resonator and a second SAW resonator formed on the piezoelectric substrate, the first SAW resonator having a first resonance frequency, the second SAW resonator having a second resonance frequency higher than the first resonance frequency; and
   a second filter having a third SAW resonator and a fourth SAW resonator formed on the piezoelectric substrate, the third SAW resonator having a third resonance frequency higher than the first resonance frequency, the fourth SAW resonator having a fourth resonance frequency higher than the second resonance frequency and the third resonance frequency;
   wherein the second SAW resonator is disposed adjacent to the first end of the piezoelectric substrate and adjacent to the first SAW resonator, the second SAW resonator and the third SAW resonator being mutually separated.

2. The SAW duplexer of claim 1, wherein at least one of the first SAW resonator and the fourth SAW resonator is disposed between the second SAW resonator and the third SAW resonator.

3. The SAW duplexer of claim 2, wherein the third SAW resonator is disposed adjacent to the second end of the piezoelectric substrate.

4. The SAW duplexer of claim 3, wherein the first SAW resonator is disposed between the second SAW resonator and the fourth SAW resonator, and the fourth SAW resonator is disposed between the second SAW resonator and the third SAW resonator.

5. The SAW duplexer of claim 1, wherein the first filter is a ladder filter having a shunt arm including the first SAW resonator and a series arm including the second SAW resonator, and the second filter is a ladder filter having a shunt arm including the third SAW resonator and a series arm including the fourth SAW resonator.

6. The SAW duplexer of claim 5, wherein the first filter is a receiving filter and the second filter is a transmitting filter.

7. The SAW duplexer of claim 1, wherein each one of the first, second, third, and fourth SAW resonators separately comprises:
   a pair of reflectors; and
   an interdigital transducer disposed between the reflectors.

8. The SAW duplexer of claim 1, wherein the piezoelectric substrate has a groove separating the first filter from the second filter.

9. A surface-acoustic-wave (SAW) duplexer comprising:
   a piezoelectric substrate having a first end and a second end opposite the first end;
   a first ladder filter having a first series-arm SAW resonator formed on the piezoelectric substrate adjacent said first end, and a first shunt-arm SAW resonator formed on the piezoelectric substrate adjacent the series-arm SAW resonator, the first shunt-arm SAW resonator having a first resonance frequency, the first series-arm SAW resonator having a second resonance frequency higher than the first resonance frequency; and
   a second ladder filter having a second series-arm SAW resonator formed on the piezoelectric substrate adjacent the first shunt-arm SAW resonator, and a second shunt-arm SAW resonator formed on the piezoelectric substrate between the second series-arm SAW resonator and said second end, the second shunt-arm SAW resonator having a third resonance frequency higher than the second resonance frequency, the second series-arm SAW resonator having a fourth resonance frequency higher than the third resonance frequency.

10. The SAW duplexer of claim 9, wherein the first series-arm SAW resonator, the first shunt-arm SAW resonator, the second series-arm SAW resonator, and the second shunt-arm SAW resonator are disposed side by side in a row.

11. The SAW duplexer of claim 9, wherein the first ladder filter is a receiving filter and the second ladder filter is a transmitting filter.

12. The SAW duplexer of claim 9, wherein the first series-arm SAW resonator, the first shunt-arm SAW resonator, the second series-arm SAW resonator, and the second shunt-arm SAW resonator each separately comprises:

a pair of reflectors; and an interdigital transducer disposed between the reflectors.

13. The SAW duplexer of claim 9, wherein the piezoelectric substrate has a groove separating the first ladder filter from the second ladder filter.

14. A surface-acoustic-wave (SAW) duplexer having a piezoelectric substrate, a first filter having a first passband, and a second filter having a second passband, the first passband being lower than the second passband, the first filter including a first plurality of SAW resonators formed on the piezoelectric substrate, among which a first SAW resonator has a highest resonance frequency, the second filter including a second plurality of SAW resonators formed on the piezoelectric substrate, among which a second SAW resonator has a lowest resonance frequency, wherein:

the piezoelectric substrate has a first end and a second end opposite the first end; and the first SAW resonator is separated from the second SAW resonator on the piezoelectric substrate and is disposed adjacent to the first end of the piezoelectric substrate.

15. The SAW duplexer of claim 14, wherein the first filter and the second filter are ladder filters, the first SAW resonator is a series-arm SAW resonator of the first filter, and the second resonator is a shunt-arm SAW resonator of the second filter.

16. The SAW duplexer of claim 14, wherein the second SAW resonator is disposed adjacent to the second end of the piezoelectric substrate.

17. The SAW duplexer of claim 16, wherein the SAW resonators of the first filter and the SAW resonators of the second filter are disposed in a single row on the piezoelectric substrate.

18. The SAW duplexer of claim 14, wherein the first filter is a receiving filter and the second filter is a transmitting filter.

19. The SAW duplexer of claim 14, wherein the piezoelectric substrate 20 has a groove separating the first filter from the second filter.

20. The SAW duplexer of claim 14, wherein the second resonance frequency is higher than the first resonance frequency.

* * * * *